(12) United States Patent
Shimomura et al.

(10) Patent No.: US 11,146,163 B2
(45) Date of Patent: Oct. 12, 2021

(54) SWITCHING DEVICE AND METHOD FOR CONTROLLING SWITCHING DEVICE

(71) Applicant: NISSAN MOTOR CO., LTD., Yokohama (JP)

(72) Inventors: Taku Shimomura, Kanagawa (JP); Tetsuya Hayashi, Kanagawa (JP); Akinori Okubo, Kanagawa (JP); Daiki Sato, Kanagawa (JP); Yuichi Iwasaki, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 0 days.

(21) Appl. No.: 16/978,294

(22) PCT Filed: Mar. 7, 2018

(86) PCT No.: PCT/JP2018/008819
§ 371 (c)(1),
(2) Date: Sep. 4, 2020

(87) PCT Pub. No.: WO2019/171509
PCT Pub. Date: Sep. 12, 2019

(65) Prior Publication Data
US 2020/0395838 A1    Dec. 17, 2020

(51) Int. Cl.
*H02M 1/08*    (2006.01)
*H02M 1/00*    (2006.01)

(52) U.S. Cl.
CPC ............ *H02M 1/08* (2013.01); *H02M 1/0009* (2021.05); *H02M 1/0054* (2021.05)

(58) Field of Classification Search
None
See application file for complete search history.

(56) References Cited

U.S. PATENT DOCUMENTS

| | | | |
|---|---|---|---|
| 5,926,012 A | 7/1999 | Takizawa et al. | |
| 6,906,574 B2* | 6/2005 | Ohi .................. | H03K 17/08128 327/392 |
| 8,373,451 B1* | 2/2013 | Ferguson ......... | H03K 19/01714 327/108 |
| 8,395,422 B2* | 3/2013 | Ogawa ............. | H03K 17/08122 327/109 |
| 8,519,748 B2* | 8/2013 | Aoki .................. | H01L 27/0629 327/108 |
| 8,928,363 B2* | 1/2015 | Hatanaka ............ | H01L 27/0629 327/109 |
| 10,476,495 B2* | 11/2019 | Shimomura ......... | H03K 17/162 |

(Continued)

FOREIGN PATENT DOCUMENTS

JP    2008-278584 A    11/2008
JP    2015-211584 A    11/2015
(Continued)

*Primary Examiner* — Jeffery S Zweizig
(74) *Attorney, Agent, or Firm* — Foley & Lardner LLP

(57) ABSTRACT

The present disclosure includes a drive circuit (2-4) for switching a switching element, and a variable capacity circuit (6A), connected between a control terminal (G) of the switching element and the drive circuit (2-4), capable of switching at least between a first capacity value and a second capacity value different from the first capacity value, and controls a capacity value between the control terminal and the drive circuit via the variable capacity circuit.

13 Claims, 7 Drawing Sheets

(56) References Cited

U.S. PATENT DOCUMENTS 10,866,272 B2 * 12/2020 Nakatani ............... G06F 30/367
2004/0041201 A1 3/2004 Sugiyama et al.

FOREIGN PATENT DOCUMENTS

| JP | 2016-77057 A | 5/2016 |
| JP | 2017-158013 A | 9/2017 |
| WO | WO 2016/175137 A1 | 11/2016 |

* cited by examiner

SWITCHING DEVICE AND METHOD FOR CONTROLLING SWITCHING DEVICE

TECHNICAL FIELD

The present invention relates to a switching device and method for controlling switching device.

BACKGROUND ART

A drive circuit of a semiconductor switching element including a drive control signal generator generating a drive control signal for driving the semiconductor switching element, a first transistor and a second transistor, connected in order between a positive potential and a negative potential, that alternately is in an ON state in accordance with the drive control signal, a resistive element connected between a connection point of the first transistor and a second transistor and a control terminal of the semiconductor switching element, a capacitor connected in parallel with the resistive element, and a switch connected in parallel with the resistive element and connected in series to the capacitor is known (Patent Document 1).

PRIOR ART DOCUMENT

Patent Document

[Patent Document 1] JP 2016-77057 A

SUMMARY OF INVENTION

Problems to be Solved by Invention

In prior arts, because a value of a capacitor capacity is fixed, there is a problem that, for example, a switching loss increases when operating conditions of the switching element is changed such as by a change in a current value of current flowing through the switching element in an ON state, etc.

A problem to be solved by the present invention is to provide a switching device and a method for controlling the switching device that can appropriately reduce the switching loss in accordance with the operating conditions of the switching element.

Means for Solving Problems

The present invention solves the above problem by including a drive circuit for switching the switching element, and a variable capacity circuit connected between a control terminal of the switching element and the drive circuit, and capable of switching at least between a first capacity value and a second capacity value different from the first capacity value, and by controlling the capacity value between the control terminal and the drive circuit via control to the variable capacity circuit.

Effect of Invention

According to the present invention, a switching loss can be appropriately reduced in accordance with the operating conditions of the switching element.

MODES FOR CARRYING OUT THE INVENTION

In the following embodiments of the present invention are explained based on the drawings.

First Embodiment

Figure 1:
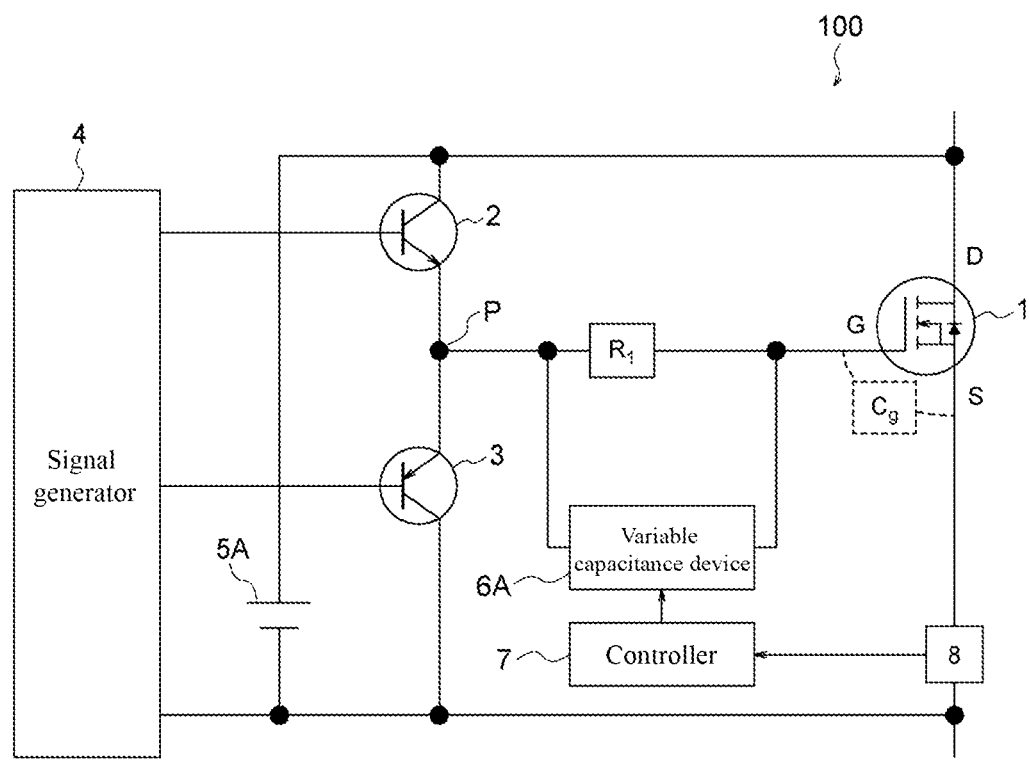
FIG. 1 is a circuit diagram of a switching device according to a first embodiment.

FIG. 1 is a circuit diagram of the switching device 100 according to the first embodiment. The switching device 100 according to the present embodiment is a drive circuit for driving a switching element included to the power converter circuit or the like, and for example, used for a part of the inverter circuit included to the power converter.

The switching device 100 includes a switching element 1, a transistor 2 and a transistor 3 constituting a push-pull circuit, a signal generator 4, a power source for driving 5A, a variable capacitance device 6A, a controller 7, and a current sensor 8.

The switching element 1 is a circuit element included to a main circuit. The main circuit is a circuit of main parts among the devices applied to the switching device. For example, when the switching device is applied to the power converter, the switching element 1 corresponds to the switching element included to the power converter.

The switching element 1 includes a control terminal, a high potential side terminal, and a low potential side terminal. For the switching element 1, a semiconductor element so-called a power semiconductor is used. For the switching element 1, for example, a MOSFET, IGBT, etc., can be used. Particularly, use of a wide band-gap semiconductor such as a SiC, or GaN, etc. is preferable. In this way, a high-speed switching operation is enabled, and a switching loss can be reduced. In the present embodiment, for the switching element 1, a MOSFET is used, a control terminal corresponds to a gate terminal G, a high potential side corresponds to a drain terminal D, and a terminal on the low potential side corresponds to a source terminal S.

A threshold voltage ($V_{th}$) for switching ON and OFF is set to the switching element 1 in advance. The threshold voltage is voltage that changes depending on an internal structure of the switching element 1. When a gate voltage of the switching element 1 is higher than the threshold voltage, the switching element 1 is ON state, and when the gate voltage is lower than the threshold voltage, the switching element 1 is OFF state. For convenience of explanation, voltage applied to the gate terminal of the switching element 1 is called as gate voltage.

The transistors 2 and 3 are the transistors constituting the push-pull circuit. The transistor 2 is a PNP-type transistor and the transistor 3 is an NPN-type transistor. Each of the transistor 2 and the transistor 3 includes a base terminal, collector terminal, and emitter terminal. The base terminal of the transistor 2 is connected to the signal generator 4 and the collector terminal of the transistor 2 is connected to the high potential side of the power source for driving 5A, and the emitter terminal of the transistor 2 is connected to the gate terminal of the switching element 1 via a resistance $R_1$. In addition, a base terminal of the transistor 3 is connected to the signal generator 4, and the collector terminal of the transistor 3 is connected to the low potential side of the power source for driving 5A and to the signal generator 4. Furthermore, the collector terminal of the transistor 3 is connected to the source terminal of the switching element 1 via the current sensor 8. The emitter terminal of the transistor 3 is connected to the emitter terminal of the transistor 2 and to the gate terminal of the switching element 1 via the resistance $R_1$.

The transistor 2 and transistor 3 conduct or shut off between the emitter terminal and collector terminal in accordance with a signal input from the signal generator 4 to the base terminal. The switching element 1 is an ON state or in an OFF state in accordance with a combination of the conduction state and shut-off state of the transistor 2 and conduction state and shut-off state of the transistor 3.

For example, when the transistor 2 becomes a conducted state and the transistor 3 becomes a shut-off state according to a signal from the signal generator 4, the power source for driving 5A is conducted to the gate terminal of the switching element 1. When the output voltage of the power source for driving 5A is higher than the threshold voltage of the switching element 1, the gate voltage becomes higher than the threshold voltage and the switching element 1 becomes an ON state. Conversely, when the transistor 2 becomes a shut-off state and the transistor 3 becomes a conducted state according to the signal from the signal generator 4, the power source for driving 5A is shut-off to the gate terminal of the switching element 1, and when the gate voltage is lower than the threshold voltage, the switching element 1 becomes an OFF state. The transistors 2 and 3 preferably have the switching function as described above, such as a bipolar transistor and uni-bipolar transistor are examples.

The signal generator 4 switches ON and OFF of the switching element 1 by controlling conduction and shut-off of the transistor 2 and conduction and shut-off of the transistor 3. For convenience of explanation, operation of switching the switching element from an ON state to an OFF state and operation of switching the switching element 1 from an OFF state to an ON state are called as switching operations. The signal generator 4 generates a switching signal for switching the switching element 1 and outputs the switching signal to each of the transistor 2 and transistor 3.

Specifically, when switching the switching element 1 from an OFF state to an ON state, the signal generator 4 outputs current to the base terminal of the transistor 2 but does not output current to the base terminal of the transistor 3. In this way, the transistor 2 becomes a conducted state and transistor 3 becomes a shut-off state, and as described above, the state of the switching element 1 switches from an OFF state to an ON state. For convenience of explanation, an operation switching the switching element 1 from an OFF state to an ON state is called as a turn-on operation.

In contrast, when switching the switching element 1 from an ON state to an OFF state, the signal generator 4 does not output current to the base terminal of the transistor 2, but outputs current to the base terminal of the transistor 3. In this way, the transistor 2 becomes a shut-off state and the transistor 3 becomes a conducted state, and the state of the switching element 1 switches from an ON state to an OFF state as described above. For convenience of explanation, an operation switching the switching element 1 from the ON state to the OFF state is called as a turn-off operation.

The power source for driving 5A is a power source capable of changing the output voltage. The high potential side of the power source for driving 5A is connected to the gate terminal of the switching element 1 via the transistor 2 and the resistance $R_1$.

The resistance $R_1$ is connected between the driving circuit that switches the switching element 1 and the gate terminal of the switching element 1. In the present embodiment, the drive circuit that switches the switching element 1 corresponds to the push-pull circuit consisting of the transistor 2 and the transistor 3, the signal generator 4, and the power source for driving 5A. In the following, for convenience of explanation, the drive circuit that switches the switching element 1 is simply called as a drive circuit. In addition, the output terminal of the drive circuit, as shown in FIG. 1, corresponds to a connection point P of the transistor 2 and transistor 3. In the following, for convenience of explanation, the connection point P is called as an output terminal.

The resistance $R_1$ is a so-called gate resistance, which is a resistance to delay the rise time of the gate voltage. For example, if there is no resistance $R_1$, when a waveform with a short gate voltage rise time and steep rise is input, a waveform distortion called ringing occurs at the source terminal of the switching element 1, which is the output terminal. By inserting the resistance $R_1$ between the gate terminal and the transistor 2 and transistor 3, the rise-time of the gate voltage can be delayed, thus ringing can be suppressed even when the switching element 1 is switched. A resistance value of the resistance $R_1$ is a value designed due to a structure of the switching element 1. For example, the resistance value is set according to a resistance value of the gate resistance that exists in the gate electrode of the switching element 1, and a capacity value $C_g$ of a parasitic capacitance that exists between the gate terminal and the source terminal.

A variable capacitance device 6A is connected between the drive circuit and the gate terminal of the switching element 1. Also, the variable capacitance device 6A is connected in parallel with the resistance $R_1$.

To the variable capacitance device 6A, a control signal is input from the controller 7. The variable capacitance device 6A is a device capable of changing a capacity value between the output terminal of the drive circuit and the gate terminal of the switching element 1 according to the control signal from the controller 7. As the variable capacitance device 6A, for example, a semiconductor device capable of electrically controlling a capacity value or a combination of a capacitor capable of changing the capacity value according to a facing area of an electrode (for example, a trimmer capacitor) and a motor for controlling rotation mechanism of the capacitor may be used. The structure of the variable capacitance device 6A is not limited. More, the capacity value indicates a value of the electrostatic capacitance.

Further, in the present embodiment, the variable capacitance device 6A can be switched at least between a capacity value of default conditions and another capacity value different from the capacity value. The default conditions include a condition which the control signal is not input to the variable capacitance device 6A from the controller 7, and a condition which the variable capacitance device 6A cannot respond to the control signal for some reasons. Also, to the default conditions, a condition which the controller 7 intendedly stops the control to the variable capacitance device 6A is included.

For example, if the variable capacitance device 6A is a semiconductor device including a nonvolatile memory, the variable capacitance device 6A stores the capacity value under the default conditions to the nonvolatile memory in advance. Then, when the default conditions are met, the variable capacitance device 6A can change to the capacity value under the default conditions by reading the capacity value set in advance. Incidentally, the method of changing the capacity value under the default conditions is only an example and the method is not limited thereto.

Further, in the present embodiment, the variable capacitance device 6A has two types of capacity values as the capacity value of the default conditions, and either one of the capacity values becomes valid. One capacity value is a capacity value under the default conditions valid when turning off the switching element 1, and the other capacity value is the capacity value under the default conditions valid when turning on the switching element 1. The method of deciding these capacity values is described later. In the following, for convenience of explanation, the capacity value under the default conditions that becomes valid when the switching element is turned off is called as the capacity value under the default conditions for turn-off, and the capacity value under the default conditions that becomes valid when the switching element 1 is turned on1 is called as the capacity value under the default conditions for turn-on.

In addition, the variable capacitance device 6A can be switched to a capacity value different from the capacity value under the default conditions according to the control signal from the controller 7. For example, when the variable capacitance device 6A is a semiconductor device, the variable capacitance device 6A changes the capacity value according to the voltage output from the controller 7. The variable capacitance device 6A can increase or decrease the capacity value with a stepwise value or increase or decrease the capacity value with a consecutive value. The capacity value set by the variable capacitance device 6A is specifically explained in the following.

The current sensor 8 detects current flowing in the direction of the source terminal from the drain terminal of current flowing the switching element 1. The current sensor 8 outputs the detected current value to the controller 7.

The controller 7 is a control circuit for controlling the variable capacitance device 6A. The controller 7 includes a CPU, ROM, and RAM. To the controller 7, a current value of the current flowing through the switching element 1 is input from the current sensor 8. The controller 7 controls the variable capacitance device 6A based on the current value of the current flowing through the switching element 1. Then, the variable capacitance device 6A changes the capacity value according to the control signal. In this way, a capacity value of the path between the output terminal and gate terminal of the drive circuit can be changed.

Figure 2:
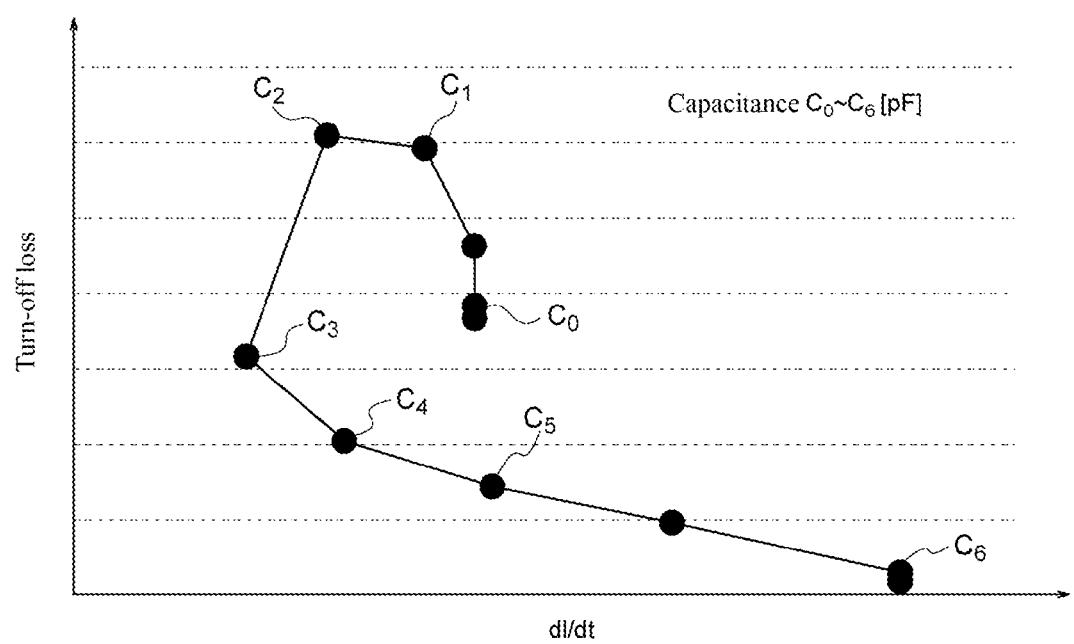
FIG. 2 is an example showing a relationship between an energy loss by a turn-off operation and a change in the current value.
Figure 3:
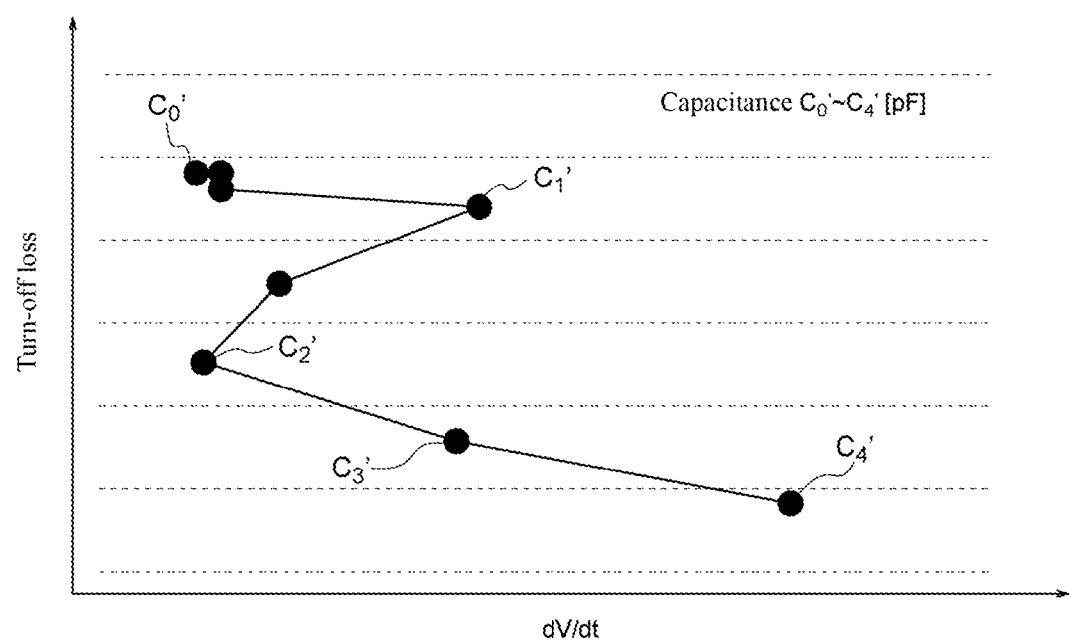
FIG. 3 is an example showing a relationship between the energy loss by the turn-off operation and a change in the voltage value.

Next, referencing FIG. 2 and FIG. 3, the capacity value of the variable capacitance device 6A changed by the controller 7 is explained. First, a capacity value of the variable capacitance device 6A for turn-off the switching element 1 is explained.

FIG. 2 is an example of a relationship between an energy loss by the turn-off operation of the switching element 1 and a change in the current value of the current flowing through the switching element 1 (dI/dt). In FIG. 2, an energy loss due to the turn-off operation of the switching element 1 is represented as a turn-off loss. Changes of the current value represent changes of the current value of the current flowing through the switching element 1 per unit time.

Also, FIG. 2 illustrates a relationship between a turn-off loss and a change in the current value when a value of an electrostatic capacitance between the drive circuit and gate terminal is changed within a range of $C_0$ to $C_6$ (unit: pF) in a circuit structure shown in FIG. 1. $C_0$ is a minimum capacity value and $C_6$ is a maximum capacity value. More, the capacity values become greater in stepwise in the order of $C_0$, $C_1$, $C_2$, $C_3$, $C_4$, $C_5$, and $C_6$ ($C_0 < C_1 \ldots < C_5 < C_6$).

Next, referencing FIG. 2, the capacity value under the default conditions for turn-off is explained. In the present embodiment, the capacity value under default conditions for turn-off is set to a value so that a change in the current value of the current flowing through the switching element 1 when turning off becomes the minimum. In an example of FIG. 2, the capacity value under the default conditions for turn-off is set to $C_3$.

Next, method for controlling the capacity value of the variable capacitance device 6A by the controller 7 is explained. In the present embodiment, the controller 7 controls the capacity value of the variable capacitance device 6A, based on the current value detected by the current sensor 8, in other words, based on the current value of the current flowing through the switching element 1.c The current value of the current flowing through the switching element 1 is a current value of the current that flows from the drain terminal of the high potential side of the switching element 1 to the source terminal which is a low potential side.

Also, in the present embodiment, the controller 7 controls the variable capacitance device 6A so that the capacity value is greater than the capacity value under the default conditions for turn-off. In other words, the controller 7 controls the capacity value of the variable capacitance device 6A in a direction where a change in the current value is greater than the change in the current value under the default conditions. Using an example of FIG. 2, the controller 7 controls a capacity value of the variable capacitance device 6A in a range of the capacity values greater than $C_3$.

Specific control method is explained. The controller 7 controls to make the capacity value of the variable capacitance device 6A smaller as the current value of the current flowing through the switching element 1 is greater. Conversely, the controller 7 controls to make the capacity value of the variable capacitance device 6A greater as the current value of the current flowing through the switching element 1 is smaller.

For example, suppose that, as a predetermined operating conditions of the switching element 1, the current value of the current flowing through the switching element 1 is $A_1$ (unit: A), and the controller 7 controls the variable capacitance device 6A so that the capacity value for the switching element 1 turn-off is $C_5$ with respect to this current value.

Under such conditions, suppose that the operating conditions of the switching element 1 are changed for some reasons and the current value of the current flowing through the switching element 1 increased to $A_2 (> A_1)$. In this case, the controller 7 controls the variable capacitance device 6A to make the capacity value smaller than $C_5$. Using the example of FIG. 2, when increase of the current value from $A_1$ to $A_2$ is detected, for example, the controller 7 controls the variable capacitance device 6A to decrease the capacity value from $C_5$ to $C_4$. As a cause of a change in operating conditions of the switching element 1, for example, a change of motor rotation speed, or the like may be mentioned when used for a power converter that drives a motor installed on a vehicle. Incidentally, decreasing the capacity value to $C_4$ is only an example, and other capacity values smaller than $C_5$ may be used.

Conversely, suppose that the operating conditions of the switching element 1 are changed for some reasons and the current value of the current flowing through the switching element 1 is decreased to $A_3$ ($<A_1$). In this case, the controller 7 controls the variable capacitance device 6A to make the capacity value greater than $C_5$. Using the example of FIG. 2, when decrease of the current value from $A_1$ to $A_3$ is detected, for example, the controller 7 controls the variable capacitance device 6A to increase the capacity value from $C_5$ to $C_6$. Incidentally, increasing the capacity value to $C_6$ is only an example and other capacity values greater than $C_5$ may be used.

Next, a capacity value of the variable capacitance device 6A when turning on the switching element 1 is explained.

FIG. 3 is an example of a relationship between an energy loss due to turn-on operation of the switching element 1 and a change in the voltage value of the voltage applied to both terminals of the switching element 1 (dV/dt). In FIG. 3, an energy loss due to turn-on operation of the switching element 1 is represented as a turn-on loss. Changes of the voltage value represent changes of the voltage value of the voltage between the drain terminal and source terminal of the switching element 1 per unit time.

Further, FIG. 3 illustrates a relationship between a turn-on loss and a change in voltage value when a value of an electrostatic capacitance between the drive circuit and gate terminal is changed within a range of $C_0'$ to $C_4'$(unit: pF) in a circuit structure shown in FIG. 1. $C_0'$ is a minimum capacity value and $C_4'$ is a maximum capacity value. Also, the capacity values are greater in stepwise in the order of $C_0'$, $C_1'$, $C_2'$, $C_3'$, and $C_4'$ ($C_0'<C_1'<C_2'<C_3'<C_4'$). These capacity values are the capacity values different from $C_0$ to $C_6$ shown in FIG. 2. In the present embodiment, the controller 7 sets each of capacity value so that the capacity value set when the switching element 1 turns on is different from the capacity value set when the switching element 1 turns off. Incidentally, the capacity value set when turning on and the capacity value set when turning off are not necessarily different capacity values and may be the same capacity values.

Next, a method for controlling the capacity value of the variable capacitance device 6A by the controller 7 is explained. In the present embodiment, the controller 7 changes the capacity value of the variable capacitance device 6A based on the current value detected by the current sensor 8, when turn-on, as well as when turn-off.

Specific control method is explained. The controller 7 controls to make the capacity value of the variable capacitance device 6A smaller as the current value of the current flowing through the switching element 1 is greater. Conversely, the controller 7 controls to make the capacity value of the variable capacitance device 6A greater as the current value of the current flowing through the switching element 1 is smaller.

For example, suppose that, as a predetermined operating conditions of the switching element 1, the current value of the current flowing through the switching element 1 is $A_1$ (unit: A), and the controller 7 controls the variable capacitance device 6A so that the capacity value for the switching element 1 turn-on is $C_3'$ with respect to this current value.

Under such conditions, suppose that the operating conditions of the switching element 1 are changed for some reasons and the current value of the current flowing through the switching element 1 increased to $A_2(>A_1)$. In such case, the controller 7 controls the variable capacitance device 6A to make the capacity value smaller than $C_3'$. Using the example of FIG. 3, when increase of the current value from $A_1$ to $A_2$ is detected, the controller 7 controls the variable capacitance device 6A to make the capacity value decrease from $C_3'$.

Conversely, suppose that operating conditions of the switching element 1 are changed for some reasons and the current value of the current flowing through the switching element 1 decreases to $A_3$ ($<A_1$). In this case, the controller 7 controls the variable capacitance device 6A to make the capacity value greater than $C_3'$. Using the example of FIG. 3, when decrease of the current value from $A_1$ to $A_3$, is detected, for example, the controller 7 controls the variable capacitance device 6A to increase the capacity value increases from $C_3'$ to $C_4'$. Incidentally, increasing the capacity value to $C_4'$ is only an example and other the capacity values greater than $C_3'$ may be used.

Thus, as the current value of the current flowing through the switching element 1 when the switching element 1 is turned on becomes greater the capacity value between the output terminal of the drive circuit and gate terminal becomes small by control of the controller 7. In this way, changes of the current value when shifting from the conducted state to the shut-off state become small and surge voltage generated in the switching element 1 when the switching element 1 turns off can be suppressed. Also, changes of the voltage value when shifting from the shut-off state to conducted state become small and the surge current generated in the switching element 1 when the switching element 1 turns on can be suppressed.

Conversely, as the current value of the current flowing through the switching element 1 when the switching element 1 is turned on becomes smaller, the capacity value between the output terminal of the drive circuit and gate terminal becomes greater. In this way, changes of the current value when shifting from the conducted state to the shut-off state can be small. Also, although the changes in the current value when shifting from the conducted state to shut-off state become greater, since the current value itself of the current flowing in an ON state of the switching element 1 is small, the maximum value of the changes of the current value (also called as a peak of the changes of the current value) can be suppressed, and generation of the surge voltage that exceeds the withstand pressure of the switching element 1 can be suppressed. Also, although changes of the voltage value when shifting from the shut-off state to conducted state become greater, since the current value itself of the current flowing in an ON state of the switching element 1 is small, the maximum value of the changes in the voltage value (also called as a peak of the changes of the voltage value) can be suppressed, and generation of the surge current that exceed the tolerance current of the switching element 1 can be suppressed.

In addition, the controller 7, in controlling the capacity value of the variable capacitance device 6A, sets the capacity value of the variable capacitance device 6A considering a parasitic capacitance of the switching element 1. In the circuit shown in FIG. 1, the gate voltage of the switching element 1 is voltage in which the output voltage of the drive circuit is divided by the capacity value of the variable capacitance device 6A and a capacity value $C_g$ of the parasitic capacitance of the switching element 1. For this reason, when the switching element 1 turns off, the controller 7 sets the capacity value of the variable capacitance device 6A so that the gate voltage is higher than the threshold voltage of the switching element 1. Also, when the switching element 1 turns on, the controller 7 sets the capacity value of the variable capacitance device 6A so that the gate voltage is lower than the threshold voltage of the switching element 1. In other words, the controller 7 sets the capacity value of the variable capacitance device 6A for turn-off within a range of the capacity values such that the switching element 1 can be turned off. In addition, the controller 7 sets the capacity value of the variable capacitance device 6A for turn-on within a range of the capacity values such that the switching element 1 can be turned on.

Additionally, the controller 7 switches the capacity value of the variable capacitance device 6A to each capacity value at a predetermined timing in the switching cycle, when the capacity value set when the switching element 1 turns off and the capacity value set when the switching element 1 turns on are different. An example of a timing for switching the capacity value is a timing just before turning off the switching element 1 and a timing just before turning on the switching element 1. For example, just before the switching element 1 is turned off, the controller 7 switches the capacity value of the variable capacitance device 6A from the capacity value for turning on to the capacity value for turning off. Conversely, for example, just before the switching element 1 is turned on, the controller 7 switches the capacity value of the variable capacitance device 6A to the capacity value for turning on from the capacity value for turning off. The controller 7 can set the timing for changing the capacity value by confirming and estimating in advance the switching cycle of the switching element 1. As the confirmation method of the switching cycle, a method for monitoring a signal output from the signal generator 4 can be mentioned. Incidentally, the confirmation method of the switching cycle is only an example, and the method is not limited thereto.

In addition, when a change in the current value input from the current sensor 8 is detected, when the controller 7 increases or decreases the capacity value of the variable capacitance device 6A. The timing for changing the capacity value is not particularly limited. For example, after a predetermined switching cycle passes after a change in the current value is detected, the controller 7 increases or decreases the capacity value of the variable capacitance device 6A just before the switching element 1 turns off or turns on. Incidentally, the timing for changing the capacity value is only an example and the timing is not limited thereto, and the capacity value may be changed at any time.

As mentioned above, the switching device 100 according to the present embodiment includes a drive circuit (a push-pull circuit and signal generator 4) for switching the switching element 1 by controlling the gate voltage of the switching element 1. In addition, the switching device 100 includes a variable capacitance device 6A which is connected between the gate terminal and drive circuit and capable of switching at least the capacity value under default conditions between a capacity value different from this capacity value. Furthermore, the switching device 100 includes a controller 7 that controls the capacity value of the electrostatic capacitance between the gate terminal and drive circuit via the control of the variable capacitance device 6A. In this way, even in a case where the operating conditions of the switching element 1 such as change in the current value of the current flowing through the switching element 1 are changed, the capacity value can be changed to an appropriate value that corresponds to the operating conditions of the switching element 1. As a result, according to the conditions of the switching operation, the switching loss of the switching element 1 can be appropriately reduced.

In addition, in the present embodiment, when a change in the current value of the current flowing through the switching element 1 per unit time is detected, the controller 7 controls the capacity value of the variable capacitance device 6A. In this way, even when the capacity value of the variable capacitance device 6A is changed, surge voltage and surge current generated at the switching element 1 can be appropriately reduced, and also the switching loss of the switching element 1 can be reduced.

Furthermore, in the present embodiment, the controller 7 controls the capacity value of the variable capacitance device 6A such that the change in a current value of the current flowing through the switching element 1 per unit time greater than a change in the current value under default conditions. This allows the controller 7 to reduce the surge voltage and surge current generated at the switching element 1 when the controller 7 cannot the variable capacitance device 6A, compared to when the controller 7 controls the variable capacitance device 6A. As a result, the load applied to the switching element 1 can be reduced.

Additionally, the switching device 100 according to the present embodiment includes a current sensor 8 detecting the current flowing through the switching element 1. The controller 7 acquires a current value of a state when the switching element 1 turns on from the current sensor 8 and controls the capacity value of the variable capacitance device 6A based on the acquired current value. This allows the capacitance value between the drive circuit and the gate terminal to be properly controlled according to the current value of the current flowing through the switching element 1.

Further, in the present embodiment, the controller 7 performs the control so as to make the capacity value of the variable capacitance device 6A smaller as the current value of the current flowing through the switching element 1 is greater and the capacity value of the variable capacitance device 6A greater as the current value is smaller. This allows the switching loss to be reduced when the current value is small, thereby increasing the efficiency of the power conversion. Also, since the current value itself is small, generation of surge voltage exceeding the withstand pressure of the switching element 1 and generation of surge current exceeding the allowable current of the switching element 1 can be suppressed.

In addition, in the present embodiment, when the switching element 1 is going to be turned off, the controller 7 sets the capacity value of the variable capacitance device 6A so that the gate voltage is lower than the threshold voltage of the switching element 1. The gate voltage is voltage in which the output voltage of the drive circuit is divided by the capacity value of the variable capacitance device 6A and the capacity value of a parasitic capacitance of the switching element 1. Since the capacity value of the variable capacitance device 6A is set by considering the parasitic capacitance, the control of the variable capacitance device 6A prevents a situation in which the switching element 1 does not turn off.

Furthermore, in the present embodiment, when the switching element is going to be turned on, the controller 7 sets the capacity value of the variable capacitance device 6A so that the gate voltage is higher than the threshold voltage of the switching element 1. Since the capacity value of the variable capacitance device 6A is set by considering the parasitic capacitance, the control of the variable capacitance device 6A prevents a situation in which the switching element 1 does not turn on.

In addition, in the present embodiment, the controller 7 sets each capacity value so that the capacity value set for the switching element 1 turn-on and the capacity value set for the switching element 1 turn-off are different. This allows the energy loss when turning off to be properly reduced, and the energy loss generated when turning on to be properly reduced. As a result, the switching loss can be reduced, and the efficiency of power conversion can be enhanced.

Second Embodiment

Figure 4:
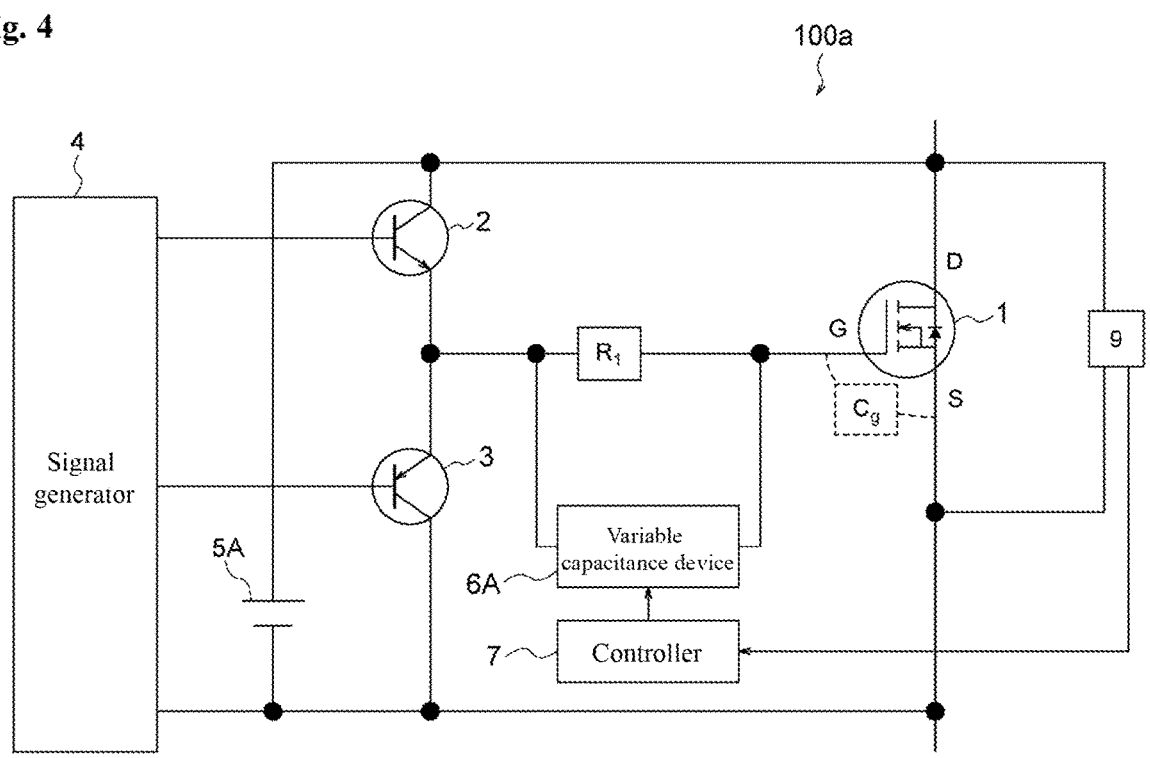
FIG. 4 is a circuit diagram of the switching device according to a second embodiment.

Next, the switching device 100a according to the second embodiment is explained. FIG. 4 is a circuit diagram of the switching device 100a according to the second embodiment. The switching device 100a of the present embodiment has the same configuration as the switching device 100 of the above embodiment except that the voltage sensor 9 is included and a method for controlling the variable capacitance device 6A by the controller 7. For this reason, in FIG. 4, for the configuration common with the switching device 100, the same symbol is used, and the explanation used in the above embodiment is referenced.

The voltage sensor 9 is a voltage sensor for detecting the voltage between the drain terminal and the source terminal of the switching element 1. The voltage sensor 9 outputs the detected voltage value to the controller 7.

In the present embodiment, the controller 7 controls the capacity value of the variable capacitance device 6A, based on the voltage value detected by the voltage sensor 9, in other words, based on the voltage value of the voltage applied to the both ends of the switching element 1. The voltage value of the voltage applied to both ends of the switching element 1 is a voltage value of voltage between the drain terminal and the source terminal of the switching element 1 in a state the switching element 1 is turned on.

A method for controlling at turn-off by the controller 7 is explained. The controller 7 controls the variable capacitance device 6A so that the capacity value is greater than the capacity value under the default conditions for turn-off, in the same ways as the embodiment described above.

Specifically, the controller 7 controls to make the capacity value of the variable capacitance device 6A smaller as the voltage value of voltage at both ends of the switching element 1 is higher. Conversely, the controller 7 controls to make the capacity value of the variable capacitance device 6A greater as the voltage value of voltage at both ends of the switching element 1 is lower.

Using the example of FIG. 2 again, for example, suppose that, as a predetermined operating conditions of the switching element 1, the voltage value of voltage at both ends of the switching element 1 is $V_1$ (unit: V) and the controller 7 controls the variable capacitance device 6A so that the capacity value for the switching element 1 turn-off is $C_5$ with respect to this voltage value.

Under such conditions, suppose that the operating conditions of the switching element 1 are changed for some reasons and the voltage value of voltage at both ends of the switching element 1 increased to $V_2(>V_1)$. In such case, the controller 7 controls the variable capacitance device 6A to make the capacity value smaller than $C_5$.

Conversely, suppose that the operating conditions of the switching element 1 are changed for some reason and the voltage value of value at both ends of the switching element 1 is decreased to $V_3$ ($<V_1$). In such case, the controller 7 controls to make the variable capacitance device 6A greater than $C_5$.

A method for controlling at turn-on by the controller 7 is explained. The controller 7 controls to make the capacity value of the variable capacitance device 6A smaller as the voltage value of voltage at both ends of the switching element 1 is higher. Conversely, the controller 7 controls to make the capacity value of the variable capacitance device 6A greater as the voltage value of voltage at both ends of the switching element 1 is lower.

Using the example of FIG. 3 again, for example, suppose that, as a predetermined operating conditions of the switching element 1, the voltage value of voltage at both ends of the switching element 1 is $V_1'$ (unit: V) and the controller 7 controls the variable capacitance device 6A so that the capacity value for the switching element 1 turn-off is $C_3'$ with respect to this voltage value.

Under such conditions, suppose that the operating conditions of the switching element 1 are changed for some reasons and the voltage value of voltage at both ends of the switching element 1 increased to $V_2(>V_1)$. In such case, the controller 7 controls the variable capacitance device 6A to make the capacity smaller than $C_3'$.

Conversely, suppose that the operating conditions of the switching element 1 are changed for some reasons, and the voltage value of value at both ends of the switching element 1 decreased to $V_3(<V_1)$. In such case, the controller 7 controls the variable capacitance device 6A to make the capacity value greater than $C_3'$.so that the capacity value becomes greater than $C_3'$.

As mentioned above, the switching device 100a according to the present embodiment includes a voltage sensor 9 for detecting the voltage applied to both terminals of the switching element 1. The controller 7 acquires voltage value in a state the switching element 1 turns on from the voltage sensor 9 and controls the capacity value of the variable capacitance device 6A based on the acquired voltage value. This allows the capacitance value between the drive circuit and the gate terminal to be properly controlled according to the voltage value of the applied voltage to both ends terminals of the switching element 1.

In addition, in the present embodiment, when a change in the voltage value of voltage applied to both terminals of the switching element 1 per unit time is detected, the controller 7 controls the capacity value of the variable capacitance device 6A. In this way, even when the operating conditions of the switching element 1 are changed, surge voltage and surge current generated at the switching element 1 can be appropriately reduced, and the switching of the switching element 1 can be reduced.

Furthermore, in the present embodiment, the controller 7 performs a control so as to make the capacity value of the variable capacitance device 6A smaller as the voltage value of the voltage applied to both terminals of the switching element 1 is higher, and the capacity value of the variable capacitance device 6A greater as the voltage value is lower. This allows the switching loss to be reduced when the voltage value is small, thereby increasing the efficiency of the power conversion. Also, since the voltage value itself is small, generation of surge voltage that exceeds the withstand pressure of the switching element 1 and generation of surge current that exceeds the allowable current of the switching element 1 can be suppressed.

Third Embodiment

Figure 5:
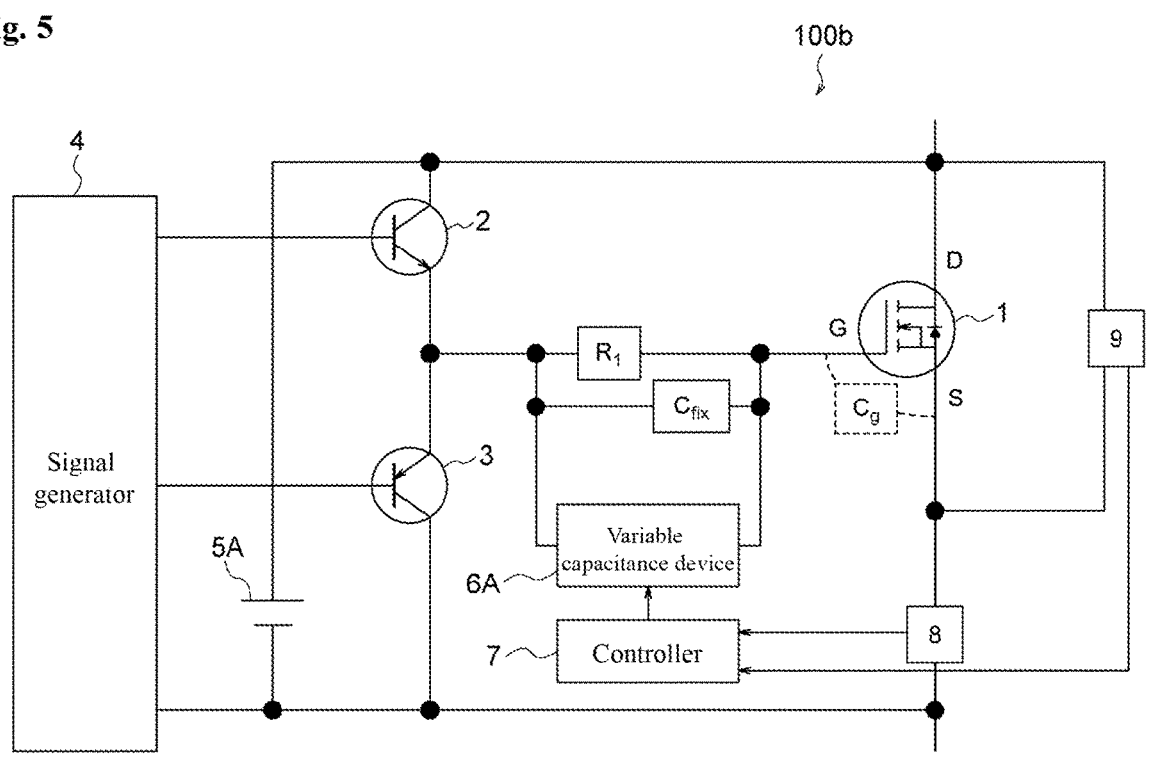
FIG. 5 is a circuit diagram of the switching device according to a third embodiment.

Next, the switching device 100b according to the third embodiment is explained. FIG. 5 is a circuit diagram of the switching device 100b according to the third embodiment. The switching device 100b of the present embodiment has the same configuration as the switching device 100 or a switching device 100a according to the embodiments described above except that a capacitor $C_{fix}$ is included. For this reason, in FIG. 5, for the configuration common with the switching device 100 and the switching device 100a, the same symbol is used, and the explanation used in the above embodiments is referenced.

The capacitor $C_{fix}$ is a capacitor constituting the capacity value between the drive circuit and the gate terminal, as well as the variable capacitance device 6A. As shown in FIG. 5, the capacitor $C_{fix}$ is connected in parallel with the resistance $R_1$ and the variable capacitance device 6A. The capacity value of the capacitor $C_{fix}$ is accordingly set according to the design of the switching device 100b.

In the present embodiment, the controller 7 controls the variable capacitance device 6A considering the capacity value of the capacitor $C_{fix}$. When the capacitor $C_{fix}$ is parallelly connected with the variable capacitance device 6A, a sum of the capacity value of the variable capacitance device 6A and capacity value of capacitor $C_{fix}$ is considered as the capacity value for the parallel circuit in general. In other words, for this reason, the controller 7 performs a control of the variable capacitance device 6A while considering the sum of the capacity value of the variable capacitance device 6A and capacity value of the capacitor $C_{fix}$ as the capacity value between the drive circuit and the gate terminal. Incidentally, for the control method, the same control method as the switching device 100 or the switching device 100a according to the above embodiment is used.

As mentioned above, the switching device 100b according to the present embodiment includes the capacitor $C_{fix}$ connected in parallel to the variable capacitance device 6A. In this way, even when the variable capacitance device 6A does not function as a capacitor and the capacity value of the variable capacitance device 6A is zero, the surge voltage and surge current generated at the switching element 1 can be suppressed. For example, as the capacity value of the capacitor $C_{fix}$, a capacity value under default conditions of the variable capacitance device 6A (either one of the capacity values for turn-off or the capacity value for turn-on) can be mentioned.

Fourth Embodiment

Figure 6:
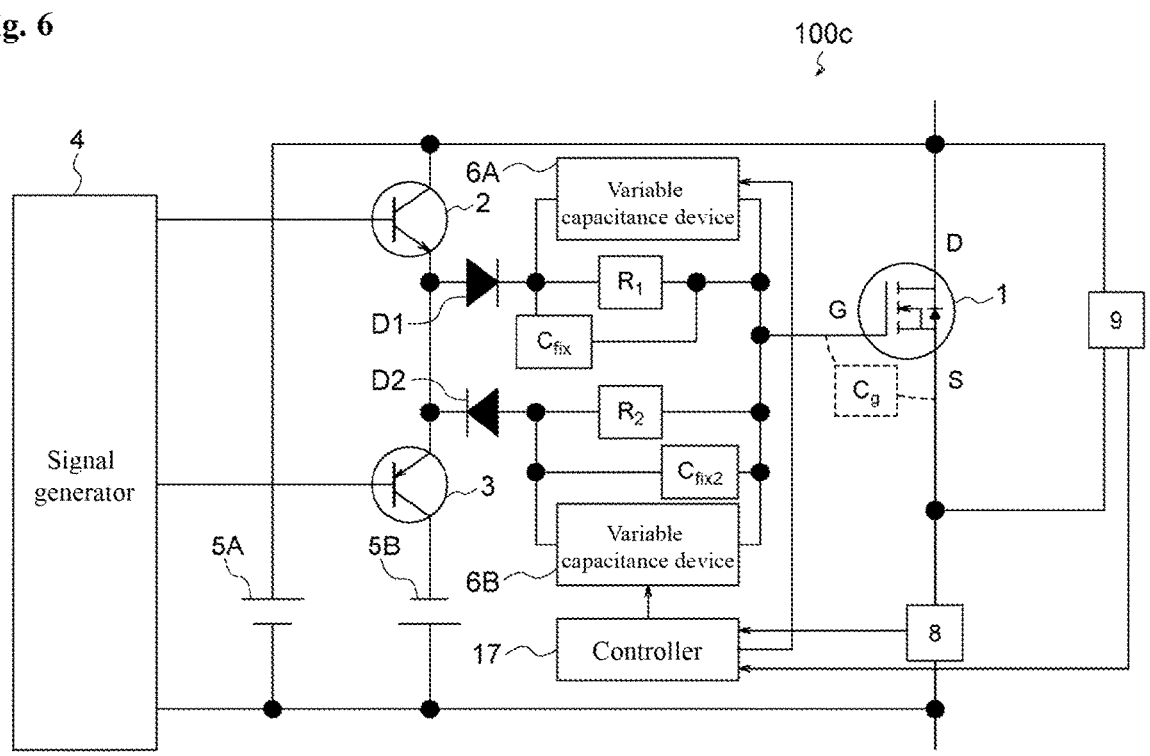
FIG. 6 is a circuit diagram of the switching device according to a fourth embodiment.

Next, the switching device 100c according to the fourth embodiment is explained. FIG. 6 is a circuit diagram of the switching device 100c according to the fourth embodiment. The switching device 100c of the present embodiment has the same configuration as the switching device 100, switching device 100a, and switching device 100b according to the above mentioned embodiments except that there are two types of paths from the drive circuit to the gate terminal, one for turn-on and one for turn-off and a method for controlling by the controller 17 is different. For this reason, in FIG. 6, for the configuration common with the switching device 100, the switching device 100a, and the switching device 100b, the same symbol is used, and the explanation used in the above embodiments is referenced.

First, among the paths from the drive circuit to the gate terminal, a path for turn-on is explained. This path consists of a diode $D_1$, a variable capacitance device 6A, the resistance $R_1$, and a capacitor $C_{fix1}$.

The diode $D_1$ is connected to the output terminal of the drive circuit. Specifically, an anode terminal of the diode $D_1$ is connected to a connection point of an emitter terminal of the transistor 2 and an emitter terminal of the transistor 3. A cathode terminal of the diode $D_1$ is connected to the variable capacitance device 6A, the resistance $R_1$, and the capacitor $C_{fix1}$. By such connection, the current that flow from the gate terminal to the drive circuit is shut-off, and the path valid for turn-on can be formed.

The capacitor $C_{fix1}$ is a capacitor that corresponds to the capacitor $C_{fix1}$ which the switching device 100b according to the third embodiment described above includes. As shown in FIG. 6, the capacitor $C_{fix1}$ is connected in parallel with the resistance $R_1$ and the variable capacitance device 6A. The capacity value of the capacitor $C_{fix1}$ is accordingly set according to the design of the switching device 100c.

In the present embodiment, the variable capacitance device 6A can change the capacity value valid when the switching element 1 turns on. The variable capacitance device 6A includes a capacity value for turn-on as a capacity value under default conditions. The capacity value under default conditions for turn-on is set to a capacity value that minimizes a change in the voltage value. In the example of FIG. 3, the capacity value under the default conditions for turn-on is set to $C_2'$.

Next, among paths from the drive circuit to the gate terminal, a path for the turn-off is explained. This path includes a diode $D_2$, a variable capacitance device 6B, a resistance $R_2$, and a capacitor $C_{fix2}$. Since the variable capacitance device 6B corresponds to the variable capacitance device 6A, the resistance $R_2$ corresponds to the resistance $R_1$, the capacitor $C_{fix2}$ corresponds to the capacitor $C_{fix1}$, for their explanations, explanation of each configuration is referenced. In addition, in the present embodiment, the resistance value of the resistance $R_1$ is different from the resistance value of the resistance $R_2$. And, the capacity value of the capacitor $C_{fix2}$ is different from the capacity value of the capacitor $C_{fix1}$.

The diode $D_2$ is connected to the output terminal of the drive circuit. Specifically, an anode terminal of the diode $D_2$ is connected to a connection point of the emitter terminal of the transistor 2 and emitter terminal of the transistor 3. A cathode terminal of the diode $D_2$ is connected to the variable capacitance device 6B, the resistance $R_2$, and the capacitor $C_{fix2}$. By such connection, the current that flow to the gate terminal from the drive circuit is shut-off and the path valid for the turn-off can be formed.

A power source for driving 5B is a power source capable of changing the output voltage. A low potential side of the power source for driving 5B is connected to the transistor 3, the diode $D_2$, and the gate terminal of the switching element 1 via the resistance $R_2$. A high potential side of the power source for driving 5B is connected to the low potential side of the power source for driving 5A, the signal generator 4, and the current sensor 8. In the present embodiment, the power source for driving 5A is a power source for turning on the switching element 1 and the power source for driving 5B is the power source for turning off the switching element 1.

The variable capacitance device 6B can change the valid capacity value valid when the switching element 1 turns off. The variable capacitance device 6B includes a capacity value for turn-off as a capacity value under default conditions. The capacity value under default conditions for turn-off is set to a capacity value that minimizes a change in the voltage value. In the example of FIG. 2, the capacity value under default conditions for turn-off is set to $C_3$.

The variable capacitance device 6B may have the same circuit configuration as the variable capacitance device 6A and may be a different circuit. To the variable capacitance device 6B, a control signal that is different from the control signal to the variable capacitance device 6A is input from the controller 17.

The controller 17 of the present embodiment controls the capacity value of the variable capacitance device 6A when the switching element 1 is going to be turned on, and controls the capacity value of the variable capacitance device 6B when the switching element 1 is going to be turned off. For example, when a change in the current value of the current sensor 8 is detected, the controller 17 changes the capacity value of the variable capacitance device 6A for changing the capacity value of the path valid for the turn-on, and also changes the capacity value of the variable capacitance device 6B for changing the capacity value of the path valid for the turn-off. Incidentally, the control method of the controller 7 according to the embodiments described above is used to determine how the capacity value is made to change as the current value is change. In addition, the configuration of making the capacity values of both the variable capacitance device 6A and the variable capacitance device 6B be controlled according to a change in the current value is an example, and the capacity values of both the variable capacitance device 6A and the variable capacitance device 6B may be controlled according to a change in the voltage value detected by the voltage sensor 9. For example, the capacity value of one variable capacitance device may be controlled according to a change in current value and the capacity value of the other variable capacitance device may be controlled according to a change in voltage value.

In addition, the controller 17 controls the capacity value of the variable capacitance device 6A so that the capacity value is greater than the capacity value under default conditions for turn-on. In other words, the controller 17 controls the capacity value of the variable capacitance device 6A in a direction where a change in the current value is greater than a change in the current value under default conditions. Using an example of FIG. 3, the controller 17 controls the capacity value of the variable capacitance device 6A in a range of the capacity values greater than $C_2'$.

In addition, the controller 17 controls the capacity value of the variable capacitance device 6B so that the capacity is greater than the capacity value under default conditions for turn-off. In other words, the controller 17 controls the capacity value of the variable capacitance device 6B in a direction where a change in the voltage value is greater than a change in the voltage value under default conditions. Using the example of FIG. 2, the controller 17 controls the capacity value of the variable capacitance device 6B in a range of the capacity values greater than $C_3$.

As mentioned above, the switching device 100c according to the present embodiment includes the diode $D_1$ provided between the drive circuit and the gate terminal, which shuts off current that flows in the direction of the drive circuit from the gate terminal, and the diode $D_2$ which shuts off that flows in the direction of the gate terminal from the drive circuit. In addition, the switching device 100c includes the variable capacitance device 6A connected to the anode terminal of the diode $D_1$ and the variable capacitance device 6B connected to the cathode terminal of the diode $D_2$. Then, the controller 17 performs a control to the variable capacitance device 6A when the switching element 1 turns on and performs a control to the variable capacitance device 6B when the switching element 1 turns off. The current path from the drive circuit to the gate terminal is separated into a current path for turn-on and a current path for turn-off. For this reason, the capacity value under default conditions for the turn-on and the capacity value under default conditions for the turn-off can be set to different values. Also, the capacity value of the capacitor $C_{fix1}$ and the capacity value of the capacitor $C_{fix2}$ can be set to different values. This allows the controller 17 to reduce the surge current generated at the switching element 1 when the controller 17 cannot the variable capacitance device 6A, compared to when the controller 7 controls the variable capacitance device 6A. In addition, this allows the controller 17 to reduce the surge voltage generated at the switching element 1 when the controller 17 cannot the variable capacitance device 6B, compared to when the controller 7 controls the variable capacitance device 6B. As a result, the load applied to the switching element 1 can be reduced.

Fifth Embodiment

Figure 7:
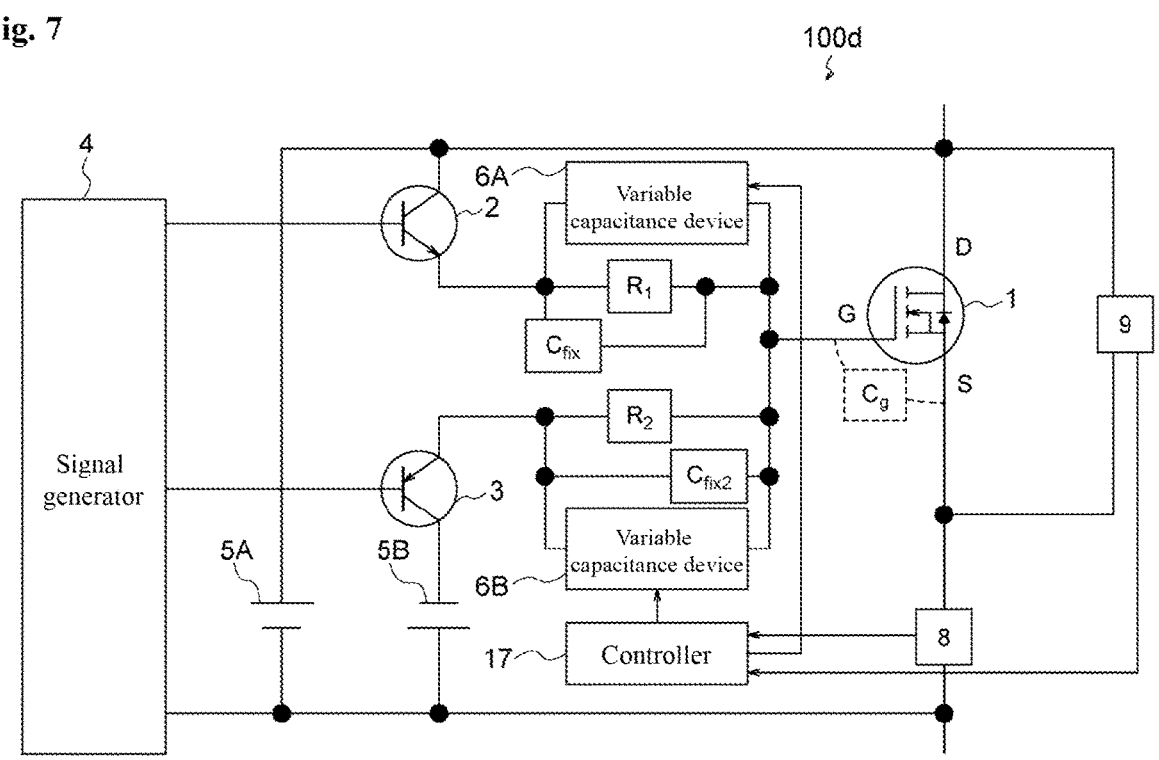
FIG. 7 is a circuit diagram of the switching device according to a fifth embodiment.

Next, the switching device 100d according to the fifth embodiment is explained. FIG. 7 is a circuit diagram of the switching device 100d according to the fifth embodiment. The switching device 100d of the present embodiment has the same configuration as the switching device 100c according to the fourth embodiment described above except that the current path for the turn-on and the current path for the turn-off are separated not by diode but a wire. For this reason, in FIG. 7, for the configuration common with the switching device 100c, the explanation used in the above embodiments are referenced.

Specifically, compared to the switching device 100c, the switching device 100d does not include the diode $D_1$ and the diode $D_2$, and the emitter terminal of the transistor 2 and the emitter terminal of the transistor 3 are not connected. In the present embodiment, when the transistor 2 turns on and transistor 3 turns off, the gate voltage by the voltage of the power source for driving 5A increases and when the increased gate voltage is higher than the threshold voltage of the switching element 1, the switching element 1 turns on. Conversely, when the transistor 2 turns off and the transistor 3 turns on, the gate voltage decreases by the voltage of the power source for driving 5B, and when the decreased gate voltage is lower than the threshold voltage of the switching element 1, the switching element 1 turns off. As above, in the present embodiment, since the current path for the turn-on and the current path for the turn-off can be separated without diode $D_1$ and diode $D_2$, number of components can be reduced compared to the switching device 100c according to the fourth embodiment. More, as with the switching device 100c, an optimal capacity value for the turn-on and an optimal capacity value for the turn-off can be set.

Additionally, the embodiment explained above is described for easy understanding of the present invention and is not intended to limit the present invention. Accordingly, all elements disclosed in the above embodiments include all design changes and equivalents that belong to the technical scope of the present invention.

For example, in the first embodiment above, the variable capacitance device 6A has a capacity value under default conditions for turn-off, but it may also have a capacity value under default for turn-on, as an example. In such case, the capacity value under default conditions for turn-on is set to a capacity value that minimizes a change in the voltage value. In an example of FIG. 3, the capacity value under default conditions for turn-on is set to $C_2'$. In addition, the controller 7 controls the capacity value of the variable capacitance device 6A so as to make the capacity value greater than the capacity value under default conditions for turn-off. Using the example of FIG. 3, the controller 7 controls the capacity value of the variable capacitance device 6A in a range of the capacity values greater than $C_2'$. This allows the controller 7 to reduce the surge current generated at the switching element 1 when the controller 7 cannot the variable capacitance device 6A, compared to when the controller 7 controls the variable capacitance device 6A.

In addition, for example, in the embodiment described above, a configuration in which the controller 7 sets the capacity value of the variable capacitance device 6A for turn-off and the capacity value of the variable capacitance device 6A for turn-on to different values, but is not limited to this. For example, the controller 7 may control the capacity value of the variable capacitance device 6A only for either switching operation. For example, when a change in the current flowing through the switching element 1 is detected, the controller 7 may control only the capacity value of the variable capacitance device 6A for turn-off or may control only the capacity value of the variable capacitance device 6A for turn-on.

Furthermore, for example, in the embodiment described above, a configuration of detecting a change in the current flowing through the switching element 1 and a change in the voltage value of voltage applied to the both ends of the switching element 1 based on the detected result by the current sensor 8 and detected result of the voltage sensor 9, a method of detecting a change in the operating conditions of the switching element 1 is not limited to this. For example, suppose that a load is connected to an output side of the switching device and there is a control device for controlling supply power to the load. In this case, the controller 7 can acquire a timing of a change in the operating conditions of the switching element 1 in advance by acquiring a signal for controlling the supply power to the load from the control device. The controller 7 may then control the capacity value of the variable capacitance device 6A in accordance with the timing at which the operating conditions of the switching element 1 are changed. This makes it possible acquire the timing at which the operating conditions of the switching element 1 are changed without providing a current sensor or a voltage sensor around the switching element 1, and the switching loss of the switching element 1 can be reduced appropriately according to the operating conditions of the switching element 1.

In addition, for example, in the present description, the switching device according to the present invention has been described using the switching devices 100, 100b, 100c, and 100d as examples, however, the present invention is not limited thereto.

Furthermore, for example, in the present description, the drive circuit according to the present invention has been described using a combination of a push-pull circuit comprising the transistor 2 and the transistor 3 and a signal generator 4 as an example, however, the present invention is not limited thereto. Any device or circuit that can switch the switching element 1 can be used.

In addition, for example, in the present description, the first capacity value according to the present invention has been described using the capacity value under default conditions as an example, however, the present invention is not limited thereto. More, the second capacity value according to the present invention has been described using the capacity when controlling the variable capacitance device as an example, however, the present invention is not limited thereto.

Furthermore, for example, in the present description, the variable capacity circuit according to the present invention has been described using the variable capacitance device 6A and variable capacitance device 6B as examples, the present invention is not limited thereto.

DESCRIPTION OF REFERENCE NUMERALS

100 . . . switching device
1 . . . switching element
2 . . . transistor
3 . . . transistor
4 . . . signal generator
5A . . . power source for driving
6A . . . variable capacitance device
7 . . . controller
8 . . . current sensor

The invention claimed is:

1. A switching device for driving a switching element, comprising:
   a drive circuit for switching the switching element by controlling control voltage applied to a control terminal of the switching element;
   a variable capacity circuit connected between the control terminal and the drive circuit, and capable of switching at least between a first capacity value and a second capacity value different from the first capacity value; and
   a controller for controlling a capacity value between the control terminal and the drive circuit via the variable capacity circuit, wherein
   the controller controls the capacity value between the control terminal and the drive circuit based on at least one of a current value of current flowing through the switching element, or a voltage value of voltage between a high potential side terminal and a low potential side terminal of the switching element.

2. The switching device according to claim 1, wherein the controller is configured to control the capacity value based on at least one of a change in a current value of current flowing through the switching element per unit time or a change in a voltage value of voltage applied to the high potential side terminal and the low potential side terminal of the switching element per unit time.

3. The switching device according to claim 1, wherein the controller is configured to control the capacity value such that a parameter of at least one of a change in a current value of current flowing through the switching element per unit time or a change in a voltage value of voltage applied to the high potential side terminal and the low potential side terminal of the switching element per unit time is greater than the parameter when control is stopped by the controller.

4. The switching device according to claim 1, comprising:
   a current sensor for detecting current flowing through the switching element, wherein
   the controller is configured to
      acquire a current value of the current from the current sensor in a state where the switching element is turned on, and
      control the capacity value based on the current value.

5. The switching device according to claim 4, wherein the controller is configured to make the capacity value smaller as the current value is greater and make the capacity value greater as the current value is smaller.

6. The switching device according to claim 1, comprising:
   a voltage sensor for detecting voltage applied to the high potential side terminal and the low potential side terminal of the switching element, wherein
   the controller is configured to
      acquire a voltage value of the voltage from the voltage sensor in a state where the switching element is turned off, and
      control the capacity value based on the voltage value.

7. The switching device according to claim 6, wherein the controller is configured to make the capacity value smaller as the voltage value is greater and make the capacity value greater as the voltage value is lower.

8. The switching device according to claim 1, comprising: a capacitor connected in parallel to the variable capacity circuit.

9. The switching device according to claim 1, wherein the controller is configured to set the capacity value such that the control voltage is lower than a threshold voltage for turning on the switching element when the switching element is going to be turned off, and the control voltage is voltage in which an output voltage of the drive circuit is divided by the capacity value and a capacity value of a parasitic capacitance of the switching element.

10. The switching device according to claim 1, wherein the controller is configured to set the capacity value such that the control voltage is higher than a threshold voltage for turning on the switching element when the switching element is going to be turned on, and the control voltage is voltage in which an output voltage of the drive circuit is divided by the capacity value and a capacity value of a parasitic capacitance of the switching element.

11. The switching device according to claim 1, wherein the controller is configured to set each of the capacity value such that the capacity value set for a switching element turn-on and the capacity value set for a switching element turn-off are different.

12. The switching device according to claim 1, the variable capacity circuit comprises a first variable capacity circuit and a second variable capacity circuit, the first variable capacity circuit is connected to a cathode terminal of a first diode and capable of switching at least between two different capacity values, wherein the first diode is provided between the drive circuit and the control terminal, which shuts off current flowing in a direction from the control terminal to the drive circuit, the second variable capacity circuit is connected to an anode terminal of a second diode and capable of switching at least between two different capacity values, wherein the second diode is provided between the drive circuit and the control terminal, which shuts off current in a direction from the drive circuit to the control terminal, and the controller is configured to perform a control of the first variable capacity circuit when the switching element turns on and perform a control of the second variable capacity circuit when the switching element turns off.

13. A method for controlling a switching device, comprising:
a drive circuit for switching a switching element by controlling voltage applied to a control terminal of the switching element, the method comprising:
controlling a capacity value between the control terminal and the drive circuit by controlling a variable capacity circuit connected between the control terminal and the drive circuit and capable of switching at least between a first capacity value and a second capacity value, based on at least either one of a current value of a current flowing through the switching element, or a voltage value of voltage applied to a high potential side terminal and a low potential side terminal of the switching element.

* * * * *